United States Patent [19]

Stevens

[11] Patent Number: 5,025,256

[45] Date of Patent: Jun. 18, 1991

[54] DATA TRANSMISSION CODE

[75] Inventor: Reginald W. Stevens, Stockport, Great Britain

[73] Assignee: International Computers Limited, London, England

[21] Appl. No.: 510,051

[22] Filed: Apr. 17, 1990

[30] Foreign Application Priority Data

May 31, 1989 [GB] United Kingdom ............. 8912471

[51] Int. Cl.⁵ ............................................. H03M 7/00
[52] U.S. Cl. ...................................... 341/59; 341/102; 341/106
[58] Field of Search ............... 341/59, 56, 94, 102, 341/106

[56] References Cited

U.S. PATENT DOCUMENTS

| | | | |
|---|---|---|---|
| 3,753,113 | 8/1973 | Maruta et al. | 341/56 X |
| 3,860,908 | 1/1975 | Stratton, III | 341/94 X |
| 4,155,070 | 5/1979 | Munter | 341/94 X |
| 4,216,460 | 8/1980 | Baldwin et al. | 341/102 X |
| 4,486,739 | 12/1984 | Fransazek | 341/59 |
| 4,628,297 | 12/1986 | Mita et al. | 341/56 |
| 4,855,742 | 8/1989 | Verboom | 341/102 |

Primary Examiner—J. R. Scott
Assistant Examiner—Sharon D. Logan
Attorney, Agent, or Firm—Lee, Mann, Smith, McWilliams & Sweeney

[57] ABSTRACT

An 8B:10B serial data transmission code is described, which provides an overall balance between ones and zeros, a code run bound of 4, and a worst case transition density of 40%. In addition, the code provides two special control characters which are unique in the coded bit stream and can be used for synchronization. The data can be encoded using a 256×8 ROM, and decoded using a 1024×6 ROM, with two bits being transmitted unencoded.

9 Claims, 3 Drawing Sheets

1

DATA TRANSMISSION CODE

BACKGROUND TO THE INVENTION

This invention relates to data transmission codes and, more specifically, is concerned with a method and apparatus for encoding data for serial transmission. The invention is particularly, although not exclusively, concerned with transmission of data over optical fibre links.

It is known to encode data for serial transmission using a block coding scheme, in which a block of N input data bits is encoded as a block of M code bits, M being greater than N. For example, in a 5B:6B coding scheme, a block of 5 data bits is encoded as a block of 6 code bits.

The following properties are important when devising such a coding scheme.

(a) Transition density: the number of transitions (from 0 to 1 or from 1 to 0) in each code block. The greater the transition density, the easier it is to extract clock information from the encoded signal at the receiving end, which allows the receiver electronics to be simpler and cheaper.

(b) Code run bound: the maximum number of contiguous 0's or contiguous 1's that can occur in the encoded data stream. Bandwidth limitations in the transmission link cause distortion of data waveforms transmitted over it, which can cause the width of a pulse to widen and to be interpreted wrongly. This problem can be reduced by placing severe limits on the code run bound.

(c) D.C. content: significant imbalance between the number of 0's and the number of 1's in the encoded data stream can cause severe loss of waveform integrity on A.C. coupled links, since any D.C. content cannot be transmitted and this information is simply lost at the receiver. To some extent, this loss can be accommodated by providing a higher bandwidth transmission medium or by using special compensation techniques at the receiver. However, it is much better to employ codes that are free of any net D.C. component, so as to gain the advantages of lower error rates or lower cost line components.

Telecommunications systems have employed 5B:6B codes, because they allow the above properties to be optimised with relative simplicity. However, there is clearly a mismatch between such a code and the 8-bit byte which is commonly used by data processing apparatus.

U.S. Pat. No. 4 486 739 describes an 8B:10B block coding scheme, which converts an eight-bit byte into a 10-bit code block. This overcomes the mismatch problem, since each byte can be individually encoded.

One object of the present invention is to provide an improved 8B:10B coding scheme which has improved transition density and code run bound properties compared with the scheme described in the above-mentioned U.S. patent.

SUMMARY OF THE INVENTION

According to the invention there is provided a method of encoding data in which 8-bit data bytes are encoded as 10-bit code blocks, wherein the code blocks satisfy the following rules:

(a) each code block contains either 5 bits of a first predetermined binary value (e.g. 1) and 5 bits of a second predetermined binary value (e.g. 0), or 4 bits of the first binary value, and 6 bits of the second binary value, (b) no code block has more than 4 contiguous bits of the first binary value or more than 4 contiguous bits of the second binary value, (c) each code block has at least one transition in its first three bits and at least one transition in its last three bits, (d) each code block contains at least four transitions, and (e) each code block contains at least two transitions in its first six bits and at least two transitions in its last six bits

DESCRIPTION OF AN EMBODIMENT OF THE INVENTION

Figure 1:
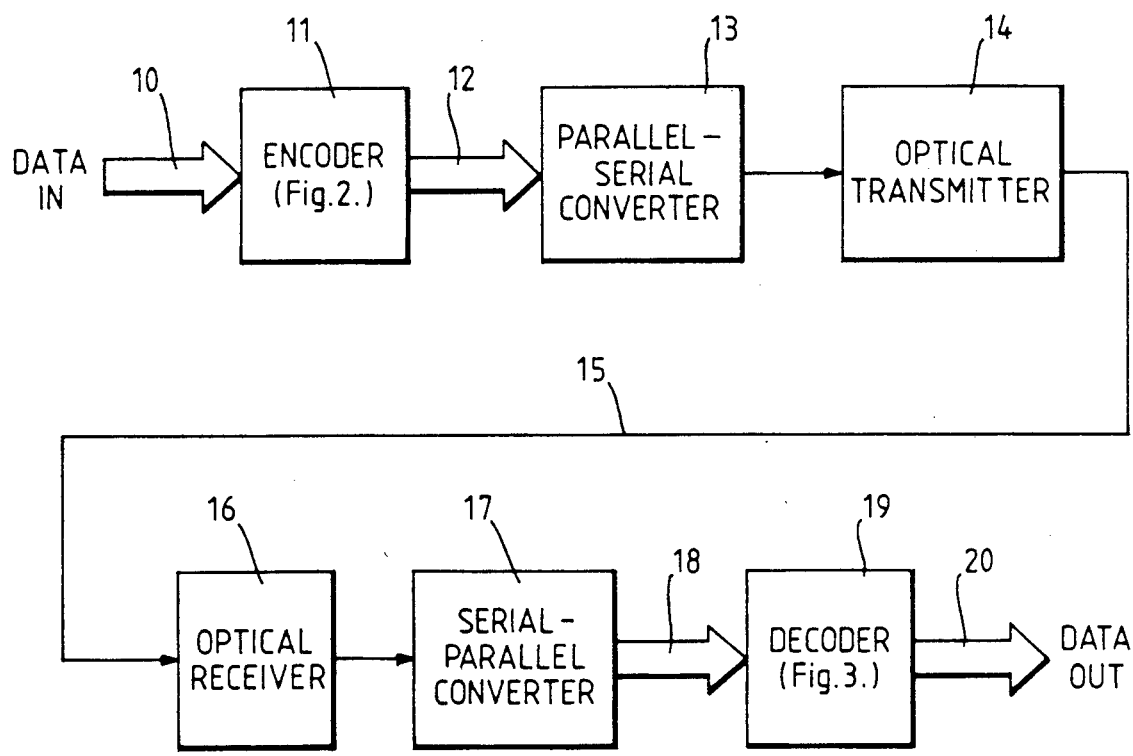
FIG. 1 shows a data transmission system.

One embodiment of the invention will now be described, by way of example, with reference to the accompanying drawings.

Coding scheme

The coding scheme to be described is an 8B:10B code, which encodes each 8-bit input data byte as a 10-bit code block.

There are 1024 possible 10-bit code blocks, but only a particular sub-set of these is used by the present encoding scheme for the purpose of encoding data bytes. This sub-set is chosen by eliminating code blocks according to the following rules.

(a) Eliminate any block that does not contain either 5 ones and 5 zeros, or 4 ones and 6 zeros. For example, the block 0000100100 contains more than six zeros, and hence is not a permissible code block. The purpose of this rule is to allow D.C. balancing of the encoded data stream, Clearly, blocks containing 5 ones and 5 zeros are intrinsically balanced. Blocks containing 4 ones and 6 zeros contain a disparity between the numbers of ones and zeros, but this disparity can be corrected, as will be described, by inverting alternate disparate blocks, to produce blocks with 6 ones and 4 zeros. This gives a net D.C. balance in the encoded data stream.

(b) Eliminate any blocks containing more than four contiguous zeros or more than four contiguous ones. For example, block 0001111101 is not permitted since it contains five contiguous ones.

(c) Eliminate any block that does not have a transition in its first three bits and also in its last three bits. For example block 0010010111 does not have a transition in its last three bits, and so is not permitted. Rules (b) and (c) together ensure that a run of more than four contiguous zeros or ones cannot occur anywhere in the encoded data stream, either within a block or between two adjacent blocks. Thus, the code run bound is 4.

(d) Eliminate any block that does not have at least four transitions in the block. For example, block 1100011100 is not permitted, since it contains only three transitions. This rule ensures that the worst case transition density in the encoded data stream is 40%.

(e) Eliminate any block that does not contain at least two transitions in the first six bits and also at least two transitions in the last six bits. For example, block 0011110100 is not permitted since it has only one transition in its first six bits.

Blocks 1000011110 and 0111100001 do not satisfy rule (d), and hence may not be used to encode data. These blocks are reserved as special control characters for synchronisation and framing. Although these blocks have only three transitions per block, in practice they are transmitted infrequently, and hence do not significantly reduce the overall transition density.

These two special control characters can easily be recognised by looking for a sequence of 4 zeros followed by 4 ones (or 4 ones followed by 4 zeros) in the encoded data stream. Such a sequence is unique, and cannot occur anywhere in the encoded data stream other than in these two special characters. In particular, rules (c) and (e) preclude the possibility that a run of 4 zeros and 4 ones (or 4 ones and 4 zeros) could occur by chance at the boundary of two adjacent blocks. For example, the situation

| XXXXXXXX00 | 001111XXXX |
| --- | --- | cannot occur, since the second of these blocks is not permitted by rule (e).

Thus, it can be seen that these two special control characters can be used for synchronisation at the receiver, to allow the boundaries of the code blocks to be uniquely recognised.

After elimination of code blocks according to the above rules, there remain 280 available blocks that comply with all the rules. Any 256 of these available blocks can be used to represent the 256 possible 8-bit byte values, and the allocation of these code blocks to byte values is arbitrary. The remaining 24 available blocks can be used for control purposes.

Encoding

The encoding can be performed using a look-up table held in a ROM (read-only memory). At first sight, it might be expected that a 256 word × 10 bit ROM would be necessary to convert the 8-bit data byte into a 10-bit code block. However, it is possible to perform this operation using a 256 word × 8 bit ROM, for the following reason.

The 280 available code blocks can be divided into four groups 00, 01, 10 and 11 according to the states of their third and eighth bits. Thus, code blocks with the third and eighth bits both equal to 0 are placed in group 00, and so on. It can be shown that, when the code blocks are grouped in this way, there are at least 64 available code blocks in each group. Consequently, it is possible to assign data byte values to the code blocks in such a manner that two predetermined bits of each data byte (for example, the last two bits) are equal to the third and eighth bits of the corresponding code block.

Thus it can be seen that these two bits of the code block can be derived directly from the two bits of the input data byte, without any encoding, and therefore there is no need to store these two bits in the ROM. This reduces the required ROM size from 256 × 10 to 256 × 8.

For example, the following allocation of code blocks to data bytes could be made:

| data byte | code block |
| --- | --- |
| 00000000 | 0101010011 |
| 00000001 | 0101010100 |
| 00000010 | 0110010011 |

-continued

| data byte | code block |
| --- | --- |
| 00000011 | 0110010100 |

It can be seen that, in each case, the third bit of the code block equals the second last bit of the data byte, and the eighth bit of the code block equals the last bit of the data byte.

The encoder must also contain means for inverting alternate disparate blocks to maintain line code balance.

Decoding

Similarly, at the receiving end, decoding can be performed by a look-up table held in a ROM. At first sight, it might be expected that a 1024 word × 8 bit ROM would be required to translate a 10-bit code block into an 8-bit output data byte. However, since two of the bits of the code block are derived directly from the input data byte, only the other 8 bits of the code block need to be decoded. Hence, only a 256 word × 6 bit ROM is required.

This reduction in the ROM size makes it necessary for the decoder to correct the polarity of the disparate blocks that were inverted at the transmitter. This can be achieved simply by inverting any block containing 6 ones. Unlike the encoder, the decoder needs no toggling action to keep track of line code balance.

Data transmission system

Referring now to FIG. 1, this is an overall block diagram of a data transmission system using the above coding scheme.

An 8-bit data byte is received on a parallel data input path 10, and is encoded by means of an encoder 11, to produce a 10-bit code block on a parallel data path 12. The code block is then converted to a serial stream of bits, by means of a parallel-to-serial converter 13. The serial data is fed to an optical transmitter 14, which sends the data over an optical fibre link 15.

At the receiving end, the serial data is received by an optical receiver circuit 16, and converted into parallel form by a serial-to-parallel converter 17, to produce a sequence of 10-bit code blocks on a parallel data path 18. Each code block is then decoded, by means of a decoder circuit 19, to produce an output data byte on path 20.

The transmitter 14 contains circuits for inserting the special control character 1000011110 at the beginning of each transmitted data packet, and appending the character 0111100001 to the end of each data frame.

The receiver 16 contains a phase-locked oscillator for extracting clock information from the incoming encoded data stream, and a block counter for counting the arrival of the ten bits in each block. The receiver 16 also contains circuits for recognising the two special control characters, so as to synchronise the block counter with the block boundaries of the received data stream.

Encoder Circuit

Figure 2:
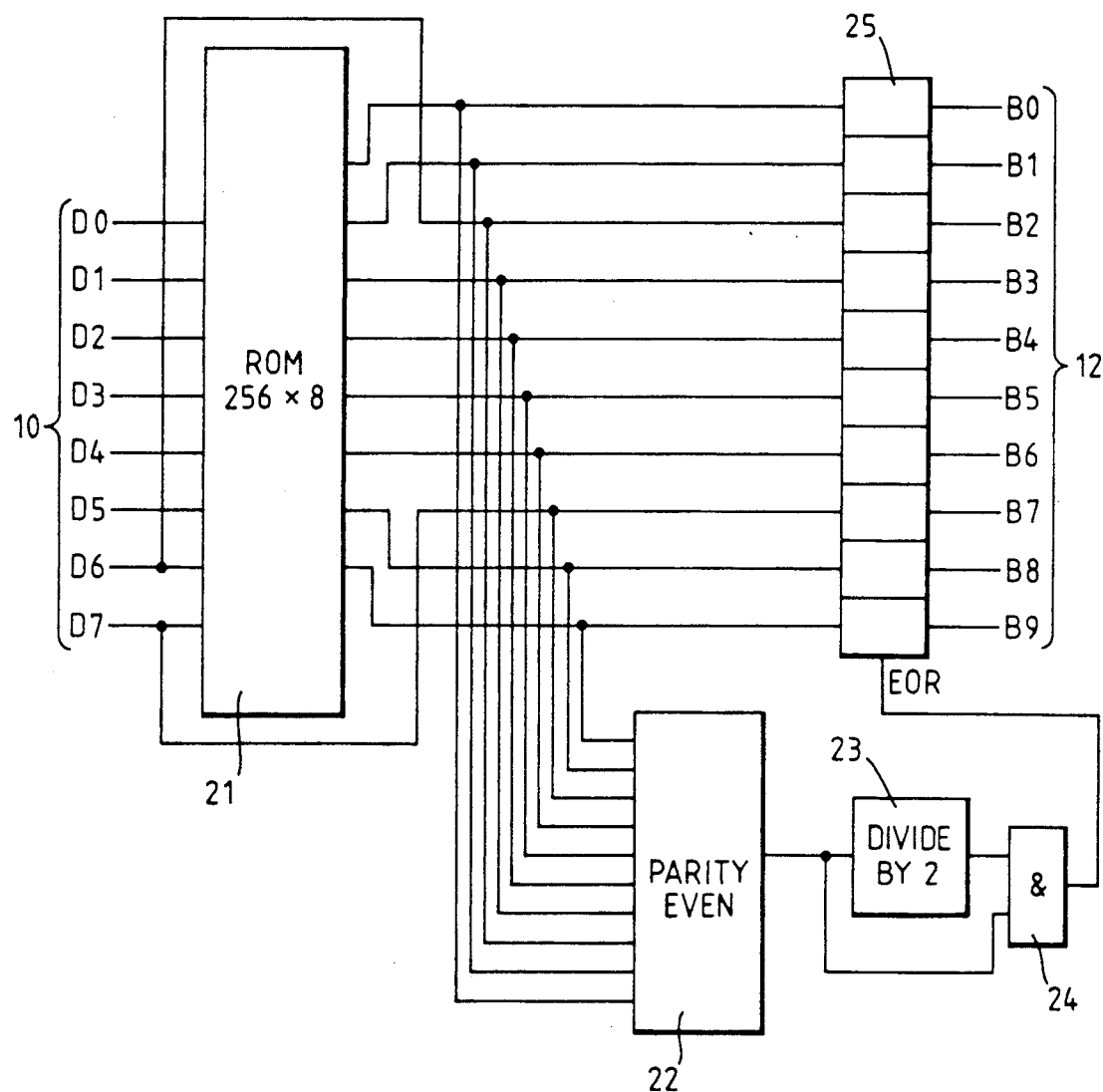
FIG. 2 shows an 8B:10B encoder for use in the transmission system.

Referring now to FIG. 2, this shows the encoder circuit 11 in more detail.

An 8-bit byte D0–D7 is received on data path 10, and is fed to the address input of a 256 word × 8 bit ROM 21. The ROM translates each input data byte into an 8-bit output. This output is then combined with bits D6 and D7 of the original data byte, to produce a 10-bit code block. Bit D6 forms the third bit of this code block, while bit D7 forms the eighth bit. The contents of the ROM are programmed in such a way that each of these code blocks complies with all the coding rules stated above.

The 10 bit code block is fed to a parity circuit 22 which checks the parity of the block. It can be seen that a balanced code block (containing 5 ones and 5 zeros) has odd parity, while a disparate code block (containing 4 ones and 6 zeros) has even parity. Thus, the parity circuit 22 detects disparate code blocks.

The output of the parity circuit 22 is fed to the input of a divide-by-two circuit 23. The outputs of the circuits 22 and 23 are combined on an AND gate 24. The output of the AND gate 24 controls a set of ten exclusive -OR gates 25, which receive the 10-bit code block, and produce a 10-bit output code block B0–B9 on the data path 12.

Thus, it can be seen that the exclusive -OR gates 25 selectively invert alternate disparate code blocks, so as to produce blocks with 6 ones and 4 zeros. Balanced code blocks are passed through the gates 25 without modification.

Decoder circuit

Figure 3:
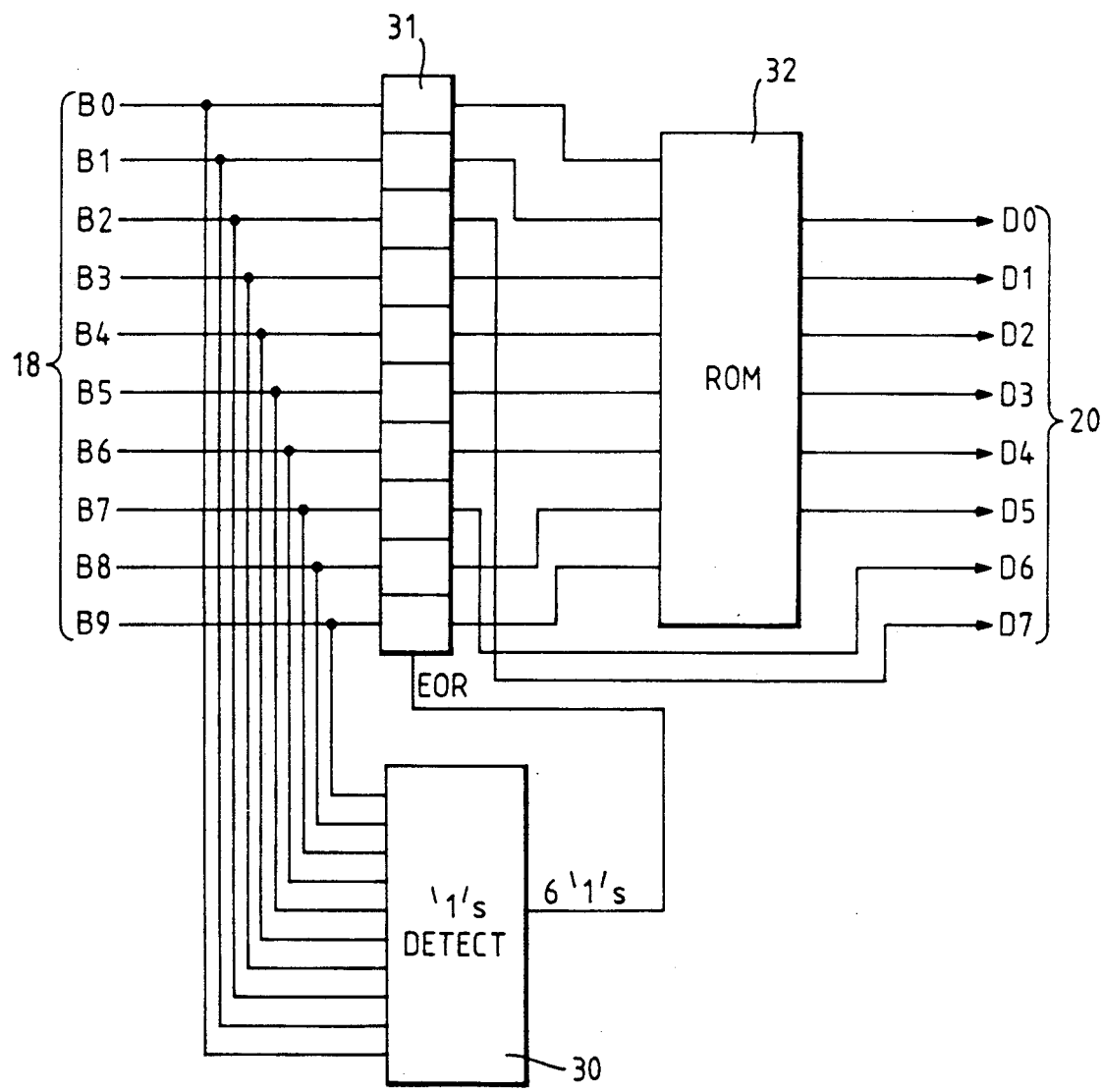
FIG. 3 shows a corresponding 10B:8B decoder.

Referring now to FIG. 3, this shows the decoder circuit 19 in more detail.

The decoder receives a 10-bit- code block B0–B9 from the path 18. This is fed to a detector circuit 30 which detects those blocks containing 6 ones and 4 zeros. The output of the detector circuit 30 controls a set of ten EXCLUSIVE-OR gates 31, so as to selectively invert all such code words.

Thus, it can be seen that the effect of this is to correct the polarity of the blocks that were inverted in the encoder circuit. All other blocks are passed through the gates 31 without modification.

The outputs of the 3rd and 8th EXCLUSIVE-OR gate 31, (i.e. those corresponding to code bits B2 and B7) directly supply output data bits D6 and D7. The outputs of the other gates 31 (i.e. those corresponding to code bits B0, B1, B3–B6, B8 and B9) are fed to the address input of a 256 word×6 bit ROM 32, which translates these eight bits into six output data bits D0–D5. These, together with the bits D6, D7, provide the decoded output data byte on path 20.

The detection circuit 30 also contains checking circuits for checking the integrity of the received data block, by examining whether the block satisfies the coding rules stated above. For example, the circuit 30 checks whether the run bound exceeds 4. Such checking provides approximately 70% detection of illegal blocks.

Summary

It can be seen that the coding scheme described above provides a code that is close to optimal for line transmission, with a run bound of 4, a continuous worst-case transition density of 40%, and no net D.C. component.

The coding scheme provides a surplus of 24 allowable code blocks over and above the 256 required for the data alphabet, which can be used for control purposes.

The coding scheme also provides two special control characters that are uniquely identifiable in the encoded bit stream and hence can be used for block synchronisation.

I claim:
1. A method of encoding data comprising:
   (I) forming a set of 10-bit code blocks satisfying the following rules:
   (a) each code block in the set contains either 5 bits of a first prdetermined binary value and 5 bits of a second predetermined binary value, or 4 bits of the first binary value, and 6 bits of the second binary value,
   (b) no code block in the set has more than 4 contiguous bits of the first binary value of more than 4 contiguous bits of the second binary value,
   (c) each code block in the set has at least one transition in the first three bits of the code block and at least one transition in the last three bits of the code block,
   (d) each code block in the set contains at least four transitions, and
   (e) each code block in the set contains at least two transitions in the first six bits of the code block and at least two transitions in the last six bits of the code block,
   (II) receiving input 8-bit data bytes; and
   (III) encoding each 8-bit data byte as one of said set of 10-bit code blocks.

2. A method according to claim 1 wherein alternate disparate code blocks (i.e. code blocks containing 4 bits of the first binary value and 6 bits of the second binary value) are inverted to maintain an overall balance between ones and zeros in the encoded data.

3. A method according to claim 1 wherein the 10-bit blocks 1000011110 and 0111100001 are used as control characters.

4. Data encoding apparatus comprising:
   (a) a 256 word×8-bit memory, having an 8-bit address input and an 8-bit data output,
   (b) means for receiving an 8-bit input data byte and applying the input data byte to said address input, and
   (c) means for combining said 8-bit data output with two predetermined bits of said input data byte, to produce a 10bit code block.

5. Apparatus according to claim 4 wherein said two predetermined bits provide the third and eighth bits of said code block.

6. Apparatus according to claim 4 further comprising means for detecting disparate code blocks (i.e. blocks containing 4 bits of the first binary value and 6 bits of the second binary value) and for selectively inverting alternate disparate code blocks.

7. Apparatus according to claim 4 wherein said code blocks satisfy the following rules:
   (a) each code block contains either 5 bits of a first predetermined binary value and 5 bits of a second predetermined binary value, or 4 bits of the first binary value, and 6 bits of the second binary value,
   (b) no code block has more than 4 contiguous bits of the first binary value or more than 4 contiguous bits of the second binary value,
   (c) each code block has at least one transition in the first three bits of the code block and at least one transition in the last three bits of the code block,
   (d) each code block contains at least four transitions, and
   (e) each code block contains at least two transitions in the first six bits of the code block and at least two transitions in the last six bits of the code block.

8. Data decoding apparatus comprising:

(a) a 1024 word×6 bit memory having a 10-bit address input and a 6-bit data output,
(b) means for receiving a 10-bit code block and applying the code block to said address input, and
(c) means for combining said 6-bit data output with two predetermined bits of said code block to produce a decoded 8-bit data output byte.

9. Apparatus according claim 8 wherein said two predetermined bits are the third and eighth bits of the code block.

* * * * *